(12) United States Patent
Li et al.

(10) Patent No.: US 11,264,297 B2
(45) Date of Patent: Mar. 1, 2022

(54) DISPLAY PANEL WITH THIN INK FILM BETWEEN SUBSTRATE AND PROTECTING FILM

(71) Applicants: Chongqing BOE Smart Electronics System Co., Ltd., Chongqing (CN); BOE Technology Group Co., Ltd., Beijing (CN)

(72) Inventors: Tianlong Li, Beijing (CN); Bei Xu, Beijing (CN); Qiangeng Cheng, Beijing (CN); Ganggui Shi, Beijing (CN); Chuanbo Zou, Beijing (CN); Zili Ou, Beijing (CN); Xuangang Li, Beijing (CN); Xingfeng Xi, Beijing (CN); Bo Liu, Beijing (CN)

(73) Assignees: Chongging BOE Smart Electronics System Co., Ltd., Chongging (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/674,071

(22) Filed: Nov. 5, 2019

(65) Prior Publication Data
US 2020/0211917 A1    Jul. 2, 2020

(30) Foreign Application Priority Data
Jan. 2, 2019    (CN) .......................... 201910002924.8

(51) Int. Cl.
*H01L 23/02*    (2006.01)
*H01L 23/04*    (2006.01)
(Continued)

(52) U.S. Cl.
CPC ...... *H01L 23/3157* (2013.01); *H01L 27/1214* (2013.01); *H01L 27/1251* (2013.01);
(Continued)

(58) Field of Classification Search
CPC ...... H05K 1/189; H05K 3/125; H01L 51/005; H01L 51/0097; H01L 23/3157;
(Continued)

(56) References Cited

U.S. PATENT DOCUMENTS 6,690,032 B1 *   2/2004   Umetsu ............... G02F 1/13452
                                                         257/72
9,170,467 B2    10/2015   Whitesides et al.
(Continued)

FOREIGN PATENT DOCUMENTS

CN      101872100 A     10/2010
CN      101989019 A      3/2011
(Continued)

OTHER PUBLICATIONS

Office Action issued for corresponding application No. 201910002924.8 dated Apr. 30, 2021.

*Primary Examiner* — Alonzo Chambliss
(74) *Attorney, Agent, or Firm* — Arent Fox LLP; Michael Fainberg

(57) ABSTRACT

Disclosed are a display panel and a display device, and the display panel includes a substrate, a thin ink film, and a protecting film stacked over each other, where an orthographical projection of the thin ink film onto the substrate covers an orthographical projection of the protecting film onto the substrate, an edge of the thin ink film is coated sealing glue.

12 Claims, 5 Drawing Sheets

(51) Int. Cl.
*H01L 23/48* (2006.01)
*H01L 21/00* (2006.01)
*H05K 7/10* (2006.01)
*H01L 23/31* (2006.01)
*H01L 27/12* (2006.01)
*H05K 1/18* (2006.01)
*H01L 27/32* (2006.01)
*H01L 51/00* (2006.01)

(52) U.S. Cl.
CPC ...... *H01L 27/3244* (2013.01); *H01L 51/0005* (2013.01); *H01L 51/0097* (2013.01); *H05K 1/189* (2013.01); *H05K 2201/10128* (2013.01)

(58) Field of Classification Search
CPC ............. H01L 27/1214; H01L 27/3276; H01L 27/1251; H01L 27/3244; H01L 51/5246; H01L 51/0005
See application file for complete search history.

(56) References Cited

U.S. PATENT DOCUMENTS

| | | | | |
|---|---|---|---|---|
| 9,488,894 | B2* | 11/2016 | Wu | G02F 1/1339 |
| 9,664,577 | B1* | 5/2017 | Liljegren | G01L 1/2287 |
| 9,759,979 | B2* | 9/2017 | Wu | G02F 1/167 |
| 10,114,267 | B2* | 10/2018 | Wu | G02B 1/14 |
| 2013/0201548 | A1 | 8/2013 | Wu et al. | |
| 2013/0258447 | A1* | 10/2013 | Wu | B32B 38/00 |
| | | | | 359/296 |
| 2015/0076722 | A1* | 3/2015 | Chiang | G02F 1/1341 |
| | | | | 264/1.37 |
| 2015/0092263 | A1* | 4/2015 | Wu | G02F 1/1339 |
| | | | | 359/296 |

FOREIGN PATENT DOCUMENTS

| | | |
|---|---|---|
| CN | 103246121 A | 8/2013 |
| CN | 107577101 A | 1/2018 |

* cited by examiner

DISPLAY PANEL WITH THIN INK FILM BETWEEN SUBSTRATE AND PROTECTING FILM

CROSS-REFERENCE TO RELATED APPLICATIONS

This application claims priority to Chinese Patent Application No. 201910002924.8, filed on Jan. 2, 2019, which is hereby incorporated by reference in its entirety.

FIELD

The present disclosure relates to the field of display technologies, and particularly to a display panel and a display device.

BACKGROUND

A display element using a thin ink film generally includes a substrate, an ink film, and a protecting film, and widely applied to an electronic label, a billboard, an electronic reader, etc. The protecting film can prevent a part of humidity from coming into contact with the ink film.

SUMMARY

Some embodiments of the disclosure provide a display panel including a substrate, a thin ink film, and a protecting film successively stacked over each other, wherein an orthographical projection of the thin ink film onto the substrate covers an orthographical projection of the protecting film onto the substrate, and an edge of the thin ink film is coated with sealing glue.

Optionally, the orthographical projection of the thin ink film onto the substrate substantially coincides with the orthographical projection of the protecting film onto the substrate, and the sealing glue covers sides of the thin ink film and the protecting film.

Optionally, an area of the orthographical projection of the thin ink film onto the substrate is larger than an area of the orthographical projection of the protecting film onto the substrate, and the sealing glue covers a part of the thin ink film beyond the protecting film.

Optionally, the part of the substrate beyond the protecting film is at least partially covered with the sealing glue.

Optionally, the thin ink film includes a display area, and a bezel area surrounding the display area, and an orthographical projection of the protecting film onto the thin ink film covers the display area and the bezel area.

Optionally, an outer edge of the orthographical projection of the protecting film onto the thin ink film is at outside of an outer contour of the bezel area.

Optionally, the outer edge of the orthographical projection of the protecting film onto the thin ink film coincides with the outer contour of the bezel area.

Optionally, the display panel further includes a driving circuit including a flexible circuit board and an integrated circuit, the integrated circuit is eclectically connected with the flexible circuit board, the integrated circuit is electrically connected with the substrate, the substrate is electrically connected with the thin ink film, and the bezel area is formed by the thin ink film according to an electric signal transmitted by the integrated circuit.

Optionally, the substrate is a thin film transistor substrate, and the thin ink film is a thin electronic ink film.

Furthermore some embodiments of the disclosure further provide a display device including the display panel according to any one of the technical solutions above.

DETAILED DESCRIPTION OF THE EMBODIMENTS

Figure 1:
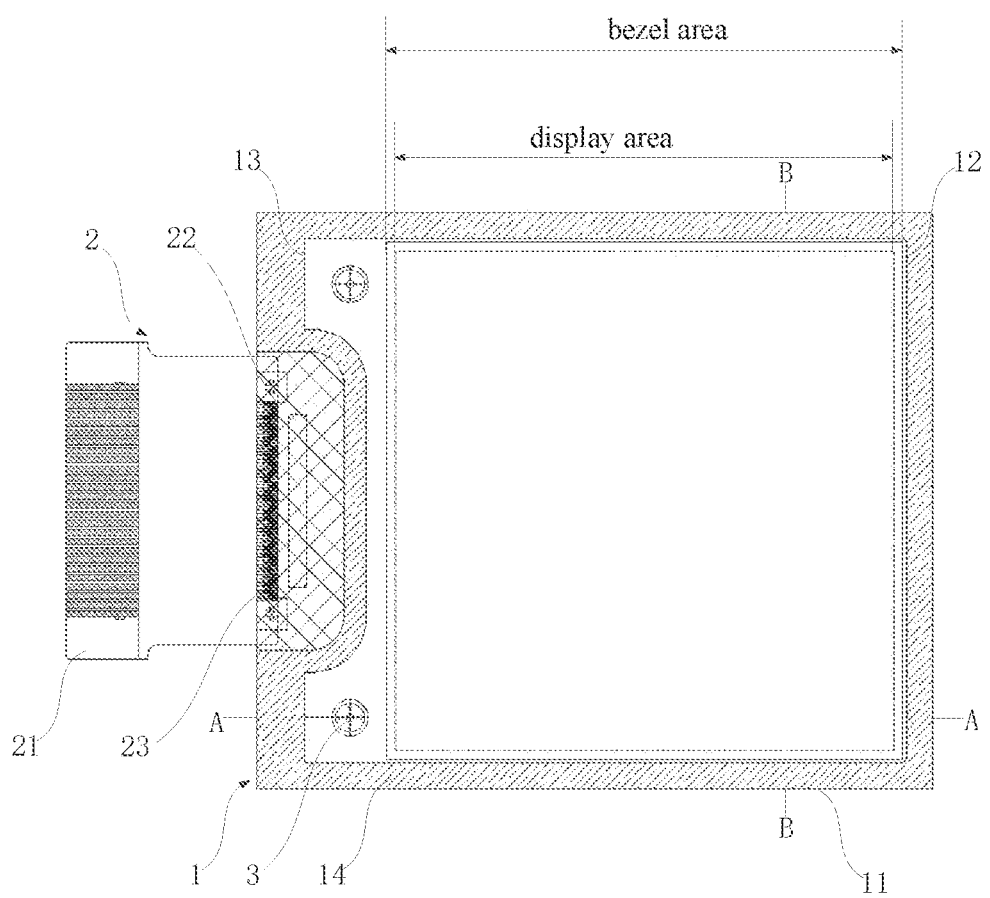
FIG. 1 is a schematic structural diagram of a display panel according to some embodiments of the disclosure.

The technical solutions according to the embodiments of the disclosure will be described below clearly and fully with reference to the drawings in the embodiments of the disclosure, and apparently the embodiments to be described below are only a part but not all of the embodiments of the disclosure. Based upon the embodiments here of the disclosure, all the other embodiments which can occur to those ordinarily skilled in the art without any inventive effort shall fall into the scope of the disclosure.

A display element using a thin ink film generally includes a substrate, an ink film, and a protecting film, and widely applied to an electronic label, a billboard, an electronic reader, etc. The protecting film can prevent a part of humidity from coming into contact with the ink film.

As illustrated in FIGS. 1-6, some embodiments of the disclosure provide a display panel 1 including a substrate 11, a thin ink film 12, and a protecting film 13 stacked over each other, where an orthographical projection of the thin ink film 12 onto the substrate 11 covers an orthographical projection of the protecting film 13 onto the substrate 11, and the edge of the thin ink film 12 is coated with sealing glue 14.

In the display panel above, the size of the protecting film 13 is reduced so that the orthographical projection of the thin ink film 12 onto the substrate 11 covers the orthographical projection of the protecting film 13 onto the substrate 11, the entire side of the protecting film 13 facing the thin ink film 12 is fit on the thin ink film 12, and the sealing glue 14 is coated at the edge of the thin ink film 12, so that the sealing glue 14 can be accumulated on the side of the thin ink film 12, which is not fit with the protecting film 13, instead of seeping into the space where the protecting film 13 is fit with the thin ink film 12, to thereby lower the possibility that air bubbles may occur, so as to avoid air bubbles from becoming undesirable while the glue is being coated on the display panel, and to improve the production efficiency and the good yield ratio. Furthermore since the size of the thin ink film 12 is no smaller than the size of the protecting film 13, the area of the sealing film 14 coated at the edge of the thin ink film 12 can be narrowed to thereby extend a visible area so as to narrow a bezel of the display panel, and to improve the display effect.

Figure 2:
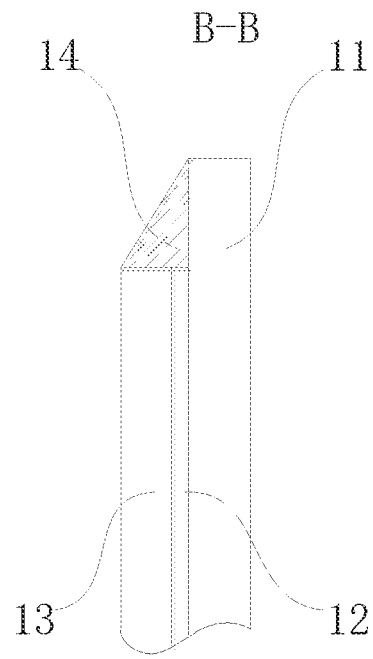
FIG. 2 is a schematic structural diagram of the display panel in FIG. 1 in a sectional view along B-B.
Figure 2:
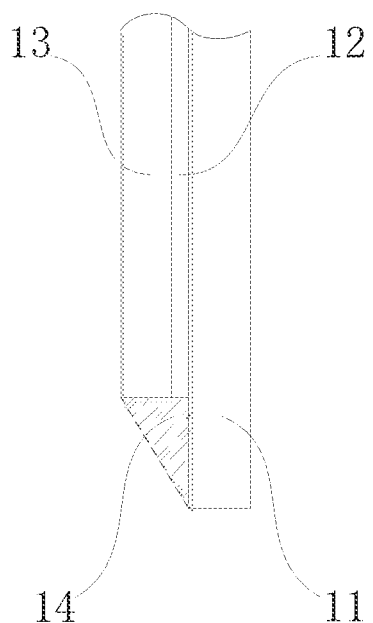
Figure 5:
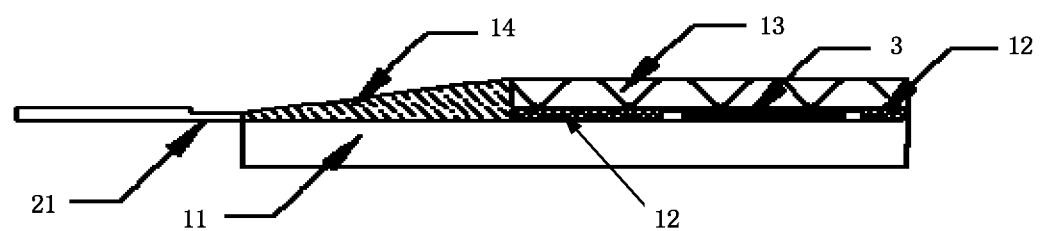
FIG. 5 is a schematic structural diagram of the display panel in FIG. 1 in a sectional view along A-A.

Further to the display panel above in which air bubbles can be avoided from becoming undesirable while the glue is being coated on the display panel, and the bezel can be narrowed, in order to enable the size of the protecting film 13 to satisfy a demand for the function thereof, the orthographical projection of the thin ink film 12 onto the substrate 11 exactly coincides with the orthographical projection of the protecting film 13 onto the substrate 11, and the sealing glue 14 covers the sides of the thin ink film 12 and the protecting film 13, in an optional implementation as illustrated in FIG. 1, FIG. 2, and FIG. 5.

In the display panel above, the orthographical projection of the thin ink film 12 onto the substrate 11 exactly coincides with the orthographical projection of the protecting film 13 onto the substrate 11, that is, the thin ink film 12 is flush with the protecting film 13 in the direction perpendicular to the substrate 11, and at this time, the size of the protecting film 13 is reduced so that the thin ink film 12 exactly can come into direct contact with the sealing glue 14; and the sealing glue 14 can cover the sides of the thin ink film 12 and the protecting film 13 to thereby prevent humidity from entering the display panel through a gap between the thin ink film 12 and a protecting layer from the sides, and at this time, the size of the protecting film 13 is the largest size for avoiding air bubbles from becoming undesirable while the glue is being coated on the display panel, and narrowing the bezel, so that the protecting film 13 can well protect the thin ink film 12 as needed.

Figure 3:
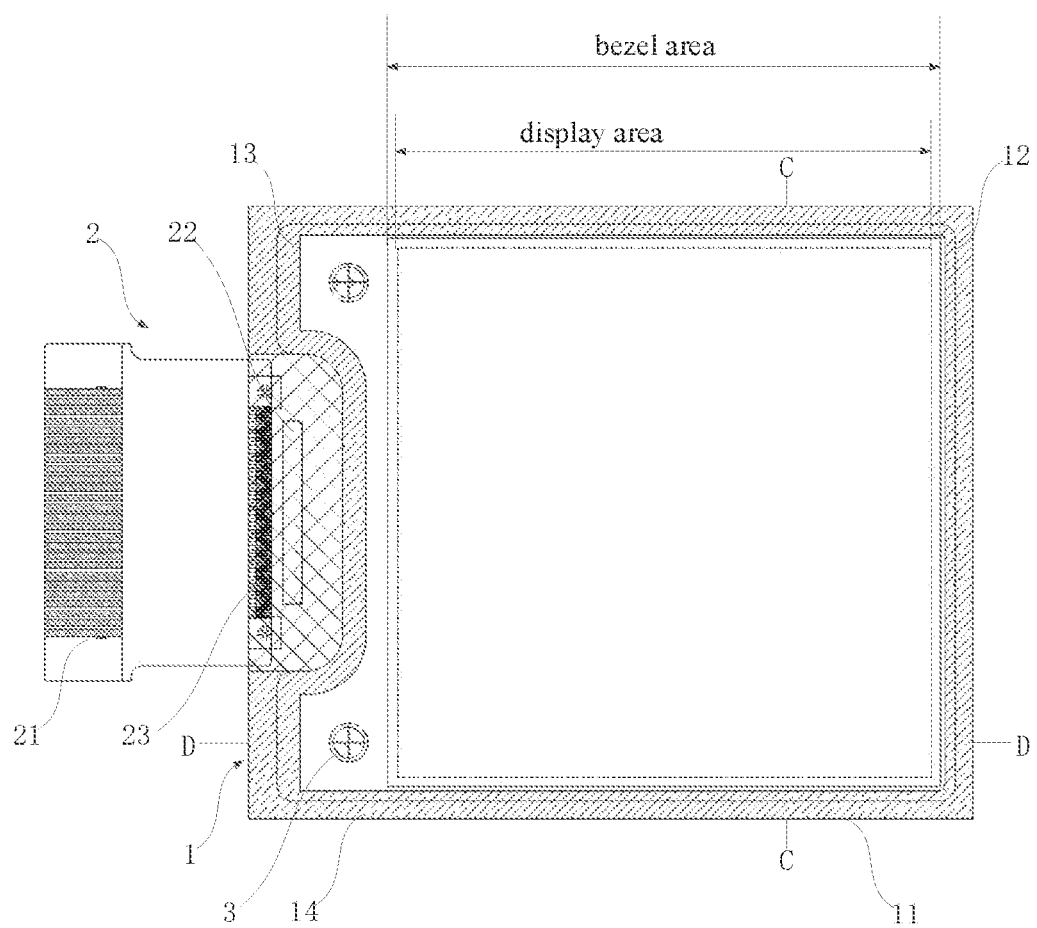
FIG. 3 is a schematic structural diagram of a display panel according to some embodiments of the disclosure.
Figure 4:
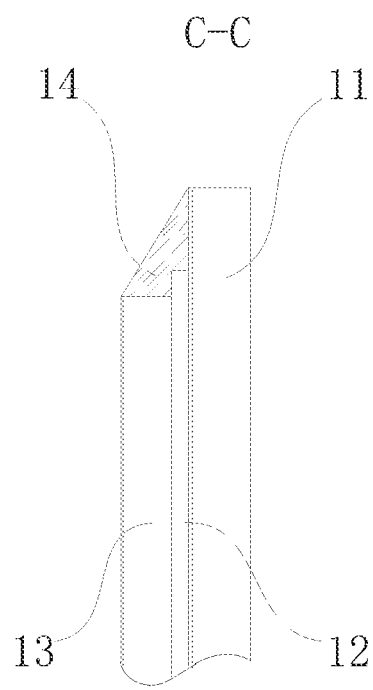
FIG. 4 is a schematic structural diagram of the display panel in FIG. 3 in a sectional view along C-C.
Figure 4:
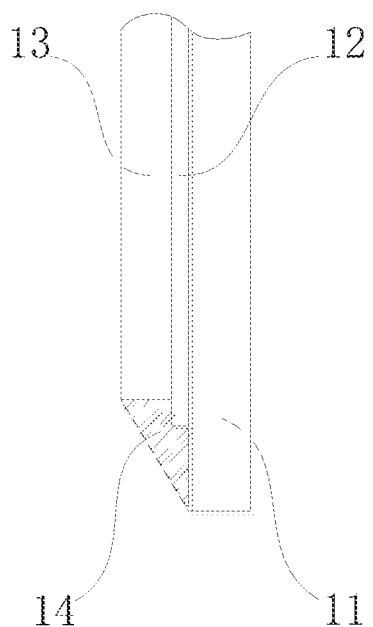
Figure 6:
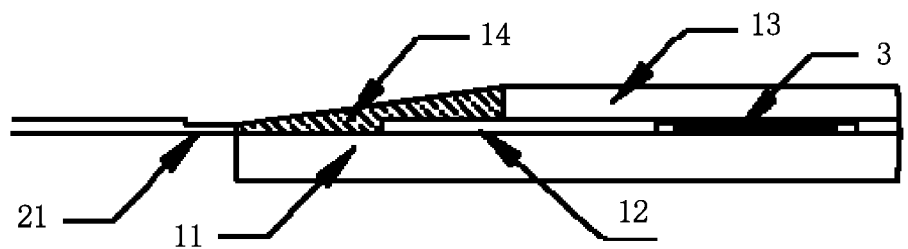
FIG. 6 is a schematic structural diagram of the display panel in FIG. 3 in a sectional view along D-D.

In order to alleviating as much as possible the air bubbles from becoming undesirable while the glue is being coated on the display panel, as illustrated in FIG. 3, FIG. 4, and FIG. 6, in an optional implementation, the area of the orthographical projection of the thin ink film 12 onto the substrate 11 is larger than the area of the orthographical projection of the protecting film 13 onto the substrate 11, and the sealing glue 14 covers the part of the thin ink film 12 beyond the protecting film 13.

In the display panel above, the area of the orthographical projection of the thin ink film 12 onto the substrate 11 is larger than the area of the orthographical projection of the protecting film 13 onto the substrate 11, that is, the size of the thin ink film 12 is larger than the size of the protecting film 13 in the extension direction of the substrate 11; and the sealing glue 14 is coated on the part of the thin ink film 12 beyond the protecting film 13 so that the sealing glue 14 can be avoided from seeping into the space where the protecting film 13 is fit with the thin ink film 12, to thereby lower the possibility that air bubbles may occur, so as to greatly alleviate air bubbles from becoming undesirable while the glue is being coated on the display panel, and to improve the production efficiency and the good yield ratio. At this time, there is much sealing glue 14 accumulated on the thin ink film 12 to thereby well prevent humidity from entering the display panel through a gap between the thin ink film 12 and the protecting film 13 from the sides.

In order to achieve a better sealing effect, as illustrated in FIGS. 1-6, optionally the part of the substrate 11 beyond the protecting film 13 is at least partially covered with the sealing glue 14.

In the display panel above, the sealing glue 14 can be coated on the part of the substrate 11 beyond the protecting film 13 to thereby prevent humidity from entering the display panel through a gap between the thin ink film 12 and the protecting layer, and a gap between the thin ink film 12 and the substrate 11 from the sides so as to better prevent humidity from entering the display panel through a gap between the thin ink film 12 and the protecting layer from the sides. Since there is no sealing glue 14 in the space where the protecting film 13 is fit with the thin ink film 12 at this time, a display area of the display panel can be extended to the area of the entire protecting film 13 to thereby extend the visible area so as to narrow the bezel, and to improve the display effect.

In order to avoid the display function of the display panel from being affected due to the reduced size of the protecting film 13, as illustrated in FIG. 1, FIG. 2, FIG. 3, and FIG. 4, in an optional implementation, the thin ink film 12 includes a display area, and a bezel area surrounding the display area, where the bezel area can delimit the largest area of the display area, and an orthographical projection of the protecting film 13 onto the thin ink film 12 covers the display area and the bezel area.

In the display panel above, in order to greatly alleviate air bubbles from becoming undesirable while the glue is being coated on the display panel, the size of the protecting film 13 can be reduced to the size of the thin ink film 12 instead of being larger than the size of the thin ink film 12 as in the related art, and can be further reduced as long as the orthographical projection of the protecting film 13 onto the thin ink film 12 covers the display area and the bezel area so that the display function of the display panel will not be affected due to the reduced size of the protecting film 13, and the display effect of the display panel can be guaranteed.

In order to guarantee a good display effect, optionally as illustrated in FIG. 1 and FIG. 3, the outer edge of the orthographical projection of the protecting film 13 onto the thin ink film 12 is at the outside far way from the display area, of the outer contour of the bezel area.

In the display panel above, the outer edge of the orthographical projection of the protecting film 13 onto the thin ink film 12 is at the outside far away from the display area, of the outer contour of the bezel area so that the display area of the display panel will not be affected, and thus a good display effect of the display panel can be guaranteed, no matter how the size of the bezel area varies.

In order to alleviate as much as possible the air bubbles from becoming undesirable while the glue is being coated on the display panel, optionally the outer edge of the orthographical projection of the protecting film 13 onto the thin ink film 12 coincides with the outer contour of the bezel area.

In the display panel above, the outer edge of the orthographical projection of the protecting film 13 onto the thin ink film 12 coincides with the outer contour of the bezel area, that is, the size of the protecting film 13 is equal to the sum of the sizes of the display area and the bezel area in the extension direction of the substrate 11; and the size of the protecting film 13 is reduced to the smallest size without affecting the display area of the display panel. At this time, the sealing glue 14 is coated on the part of the thin ink film 12 beyond the protecting film 13, and there is much sealing glue 14 accumulated on the thin ink film 12, so that on one hand, the sealing glue 14 can be avoided from seeping into the space where the protecting film 13 is fit with the thin ink film 12, to thereby lower the possibility that air bubbles may occur, so as to avoid as much as possible the air bubbles from becoming undesirable while the glue is being coated on the display panel, and to improve the production efficiency and the good yield ratio; and on the other hand, humidity can be well prevented from entering the display panel through a gap between the thin ink film 12 and the protecting layer, so as to guarantee the sealing effect.

Optionally, as illustrated in FIG. 1 and FIG. 3, the display panel further includes a driving circuit 2 including a flexible circuit board 21 and an integrated circuit 22, where the integrated circuit 22 is eclectically connected with the flexible circuit board 21, the integrated circuit 22 is electrically connected with the substrate 11, the substrate 11 is electrically connected with the thin ink film 12 through conductive adhesive 3, and the bezel area is formed of the thin ink film 12 according to an electric signal transmitted by the integrated circuit 22.

In the display panel above, UV curing glue is coated at the bending of the flexible circuit board 21 to thereby prevent the flexible circuit board 21 from being torn in use, room-temperature silicon sulfide rubber glue 23 is coated around the integrated circuit 22 to thereby protect the integrated circuit, the number of pieces of conductive adhesive 3 can be odd or even as needed, the flexible circuit board 21 is connected with a system circuit, the flexible circuit board 21 is electrically connected with the integrated circuit 22, the integrated circuit 22 transmits an electric signal to the substrate 11 electrically connected therewith, and the substrate 11 controls the thin ink film 12 through the electrical connection between a line on the surface of the substrate, and a conductive adhesive point upon reception of the electric signal to form the display area and the bezel area on the thin ink film 12 so as to display an image, where the positions of the display area and the bezel area on the thin ink film 12 are controlled by program in the integrated circuit 22.

In an optional implementation, the substrate 11 can be a thin film transistor, or can be a plastic substrate, or can be another substrate providing a desirable function, and the thin ink film 12 can be an electronic thin ink film, or can be an electronic power fluid ink film, or can be another ink film providing a desirable function. The sealing glue 14 is α-octyl cyanoacrylate (EC) glue. The EC glue is super sealing glue which can well seal a display panel and prevent humidity from entering the display panel to thereby guarantee a sealing effect of the display panel.

Furthermore some embodiments of the disclosure further provide a display device including the display panel according to any one of the technical solutions above.

In the display device above, since the display panel can avoid air bubbles from becoming undesirable while the glue is being coated on the display panel, and the bezel thereof can be narrowed, thus resulting in a good display effect, there will be a good display effect of the display device including the display panel above.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising a thin film transistor array substrate, a thin electronic ink film, and a protecting film successively stacked over each other, wherein the display panel further comprises a driving circuit arranged on a first peripheral area of the thin film transistor array substrate;

the thin electronic ink film is arranged on a display area, a bezel area surrounding the display area, and a second peripheral area of the thin film transistor array substrate; and the thin electronic ink film does not cover the driving circuit;

the protecting film is arranged on the thin electronic ink film and does not cover the driving circuit;

an entire side of the protecting film facing the thin electronic ink film is fit on the thin electronic ink film; and sealing glue comes into direct contact with a side of the thin electronic ink film or a part of the thin electronic ink film beyond the protecting film;

wherein an orthographical projection of the thin electronic ink film onto the thin film transistor array substrate substantially coincides with an orthographical projection of the protecting film onto the thin film transistor array substrate, wherein the sealing glue covers the side of the thin electronic ink film and a side of the protecting film; or an area of an orthographical projection of the thin electronic ink film onto the thin film transistor array substrate is larger than an area of an orthographical projection of the protecting film onto the thin film transistor array substrate, wherein the sealing glue covers the part of the thin electronic ink film beyond the protecting film.

2. The display panel according to claim 1, wherein the part of the thin film transistor array substrate beyond the protecting film is at least partially covered with the sealing glue.

3. The display panel according to claim 1, wherein an orthographical projection of the protecting film onto the thin electronic ink film covers the display area and the bezel area.

4. The display panel according to claim 3, wherein an outer edge of the orthographical projection of the protecting film onto the thin electronic ink film is at outside of an outer contour of the bezel area.

5. The display panel according to claim 3, wherein an outer edge of the orthographical projection of the protecting film onto the thin electronic ink film coincides with an outer contour of the bezel area.

6. The display panel according to claim 3, wherein the driving circuit comprises a flexible circuit board and an integrated circuit, the integrated circuit is eclectically connected with the flexible circuit board, the integrated circuit is electrically connected with the thin film transistor array substrate, the thin film transistor array substrate is electrically connected with the thin electronic ink film, and the bezel area is formed by the thin electronic ink film according to an electric signal transmitted by the integrated circuit.

7. A display device, comprising the display panel according to claim 1.

8. The display device according to claim 7, wherein the part of the thin film transistor array substrate beyond the protecting film is at least partially covered with the sealing glue.

9. The display device according to claim 7, wherein an orthographical projection of the protecting film onto the thin electronic ink film covers the display area and the bezel area.

10. The display device according to claim 9, wherein an outer edge of the orthographical projection of the protecting film onto the thin electronic ink film is at outside of an outer contour of the bezel area.

11. The display device according to claim 9, wherein an outer edge of the orthographical projection of the protecting film onto the thin electronic ink film coincides with an outer contour of the bezel area.

12. The display device according to claim 9, wherein the driving circuit comprises a flexible circuit board and an integrated circuit, the integrated circuit is eclectically connected with the flexible circuit board, the integrated circuit is electrically connected with the thin film transistor array substrate, the thin film transistor array substrate is electrically connected with the thin electronic ink film, and the bezel area is formed by the thin electronic ink film according to an electric signal transmitted by the integrated circuit.

\* \* \* \* \*

UNITED STATES PATENT AND TRADEMARK OFFICE
CERTIFICATE OF CORRECTION

PATENT NO. : 11,264,297 B2
APPLICATION NO. : 16/674071
DATED : March 1, 2022
INVENTOR(S) : Li et al.

Page 1 of 1

It is certified that error appears in the above-identified patent and that said Letters Patent is hereby corrected as shown below:

On the Title Page

Item (73) The assignee reads:
"Chongging BOE Smart Electronics System Co., Ltd., Chongging (CN); BOE Technology Group Co., Ltd., Beijing (CN)"

Should read:
--Chongqing BOE Smart Electronics System Co., Ltd., Chongqing (CN); BOE Technology Group Co., Ltd., Beijing (CN)--

Signed and Sealed this
Seventeenth Day of May, 2022

Katherine Kelly Vidal
*Director of the United States Patent and Trademark Office*